United States Patent [19]
McKenny et al.

[11] Patent Number: 6,021,064
[45] Date of Patent: Feb. 1, 2000

[54] LAYOUT FOR DATA STORAGE CIRCUIT USING SHARED BIT LINE AND METHOD THEREFOR

[75] Inventors: Vern McKenny, Cuchara, Colo.; James A. Cunningham, Saratoga, Calif.

[73] Assignee: Vlsi Technology, Inc., San Jose, Calif.

[21] Appl. No.: 09/018,712

[22] Filed: Feb. 4, 1998

[51] Int. Cl.[7] .................................................. G11C 7/00
[52] U.S. Cl. ........................... 365/150; 365/63; 365/174; 365/190
[58] Field of Search ............................. 365/63, 150, 174, 365/190

[56] References Cited

U.S. PATENT DOCUMENTS

| | | | |
|---|---|---|---|
| 3,727,196 | 4/1973 | McKenny | 340/173 CA |
| 3,761,899 | 9/1973 | McKenny et al. | 340/173 R |
| 3,778,783 | 12/1973 | Proebsting et al. | 340/173 R |
| 3,821,717 | 6/1974 | McKenny | 340/173 R |
| 3,881,121 | 4/1975 | Proebsting et al. | 307/303 |
| 3,949,382 | 4/1976 | Yasui | 365/204 |
| 4,281,398 | 7/1981 | McKenny et al. | 365/200 |
| 4,389,715 | 6/1983 | Eaton, Jr. et al. | 365/200 |
| 4,449,142 | 5/1984 | Tsuchiya et al. | 365/149 X |
| 4,716,548 | 12/1987 | Mochizuki | 365/149 |
| 4,841,233 | 6/1989 | Yoshida | 324/73 R |
| 4,947,378 | 8/1990 | Jinbo et al. | 365/222 |
| 5,122,986 | 6/1992 | Lim | 365/189.11 |
| 5,208,470 | 5/1993 | Lee et al. | 257/296 |
| 5,265,054 | 11/1993 | McClure | 365/200 |
| 5,287,326 | 2/1994 | Hirata | 365/230.03 |
| 5,367,213 | 11/1994 | Casper | 327/56 |
| 5,448,513 | 9/1995 | Hu et al. | 365/150 |
| 5,784,311 | 7/1998 | Assaderaghi et al. | 365/182 X |
| 5,796,650 | 8/1998 | Wik et al. | 365/174 X |
| 5,808,932 | 9/1998 | Irrinki et al. | 365/187 X |

Primary Examiner—Do Hyun Yoo

[57] ABSTRACT

An integrated circuit includes a memory array implemented with as few as two transistors, and four access lines per cell. The array includes row lines and bit lines, with the internally-arranged bit lines shared by adjacent cells. According to one embodiment, each memory cell is accessed in response to levels established on selected ones of the row and bit lines, and two adjacent memory cells are located on either side of one of the bit lines. This bit line interconnects a first MOS-based transistor in one of the two memory cells and a second MOS-based transistor in the other of the two memory cells. Other aspects of the invention are directed to advantages concerning the laying out of interconnects used in each memory cell. For example, the first MOS-based transistor can have its drain connected to the drain of the second MOS-based transistor using an interconnecting layer arranged substantially at a right angle relative to the first direction or at an acute angle relative to the first direction.

11 Claims, 6 Drawing Sheets

LAYOUT FOR DATA STORAGE CIRCUIT USING SHARED BIT LINE AND METHOD THEREFOR

FIELD OF THE INVENTION

The present invention relates to semiconductor memory circuits and, more particularly to memory circuits and arrangements benefiting from reduced circuit-implementation area and methods thereof.

BACKGROUND OF THE INVENTION

Marketplace needs have created a demand for increased fast data-storage capability in an ever-decreasing package size. For many applications, this has translated to efforts to increase the number of memory cells in a given chip size (or real estate area) but using fewer elements to implement each of the cells. The tension between attempting to increase the number of memory cells while using a smaller package, has resulted in a variety of efforts and approaches to memory cell design.

One approach for attempting to minimize the space required for each cell uses three MOS transistors including five access/control lines. The access/control lines include a write select line, a read select line, a ground line, a write bit line and read bit line. The three transistors include a write transistor, an amplifying transistor, and a read transistor. The amplifying transistor has a gate connected to the source of the write transistor to define a (chargeable) storage node. This three transistor design is advantageous in that additional capacitance at the storage node is not required, thereby reducing the space and number of features required to implement such a cell. Further, data stored on the storage node can be read out to the read digit line without destroying the charge level at the storage node. This three transistor design is disadvantageous in that its implementation has required excessive space. In large scale integration, this approach has limited applications.

Another approach uses one transistor and one capacitor with multiple access/control lines. Data is stored at a storage node using the capacitor and is destructively read out of the memory cell through the transistor. The single transistor of this type of cell has combined read and write functions, thereby permitting implementation of this type of memory cell in a relatively small area and rendering the same desirable for large scale integration. For many memory applications, this memory cell design is not preferred because the data within the memory cells is destructively read out.

Yet another approach has been implemented using two transistors without an additional discrete capacitor. For access and control, the cell includes a write row line, a read row line, and a column having a write bit line and a read bit line. One of the transistors is used as the write transistor, and the other transistor is used as a read transistor. The read transistor has its gate acting as the storage node and connected to the source of the write transistor. For many applications, this two-transistor memory cell is advantageous in that information at the storage node can be read nondestructively using only two transistors. Layout implementations for this type of memory cell, however, have been inefficient.

SUMMARY OF THE INVENTION

The present invention is directed to circuit arrangements and methods involving a semiconductor chip having a memory circuit and to a semiconductor memory cell array accessed (written to and read from) using rows and columns. According to one embodiment, a bit line is shared between two adjacent memory cells. Each memory cell is accessed in response to levels established on selected ones of the row and bit lines, and two of the memory cells are adjacently-located on either side of one of the bit lines, with this one bit line interconnecting a first MOS-based transistor in one of the two memory cells and a second MOS-based transistor in the other of the two memory cells.

In a more particular embodiment, the drain of the first MOS-based transistor is connected to the drain of the second MOS-based transistor using an interconnecting layer arranged substantially at a right angle relative to the direction of the row lines, and a third MOS-based transistor within said one of the two memory cells has a source connected with a gate of the first MOS-based transistor.

In other particular embodiments, the third MOS-based transistor has its source connected with the gate of the first MOS-based transistor using two interconnecting layers arranged substantially at a right angle relative to one another, and arranged at an obtuse angle relative to one another.

A method for storing and retrieving data, according to the present invention, includes: providing a semiconductor array of memory cells arranged in row and columns using row lines and bit lines, including a write row line and a read row line arranged parallel to one another and along a first direction and including at least one bit line located between a first memory cell and a second memory cell; and storing data in the first memory cell by biasing said at least one bit line and retrieving data in the second memory cell by sensing said at least one bit line.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the detailed description of various embodiments of the invention which follows in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems and arrangements which benefit from large-scale data storage. The invention has been found to be particularly advantageous in low-power circuit applications where there is need to store large amounts of data in a compact area. Examples of such applications include but are not necessarily limited to stand-alone and embedded DRAM circuits. An appreciation of various aspects of the invention is best gained through a discussion of application examples operating in such an environment.

Figure 1:
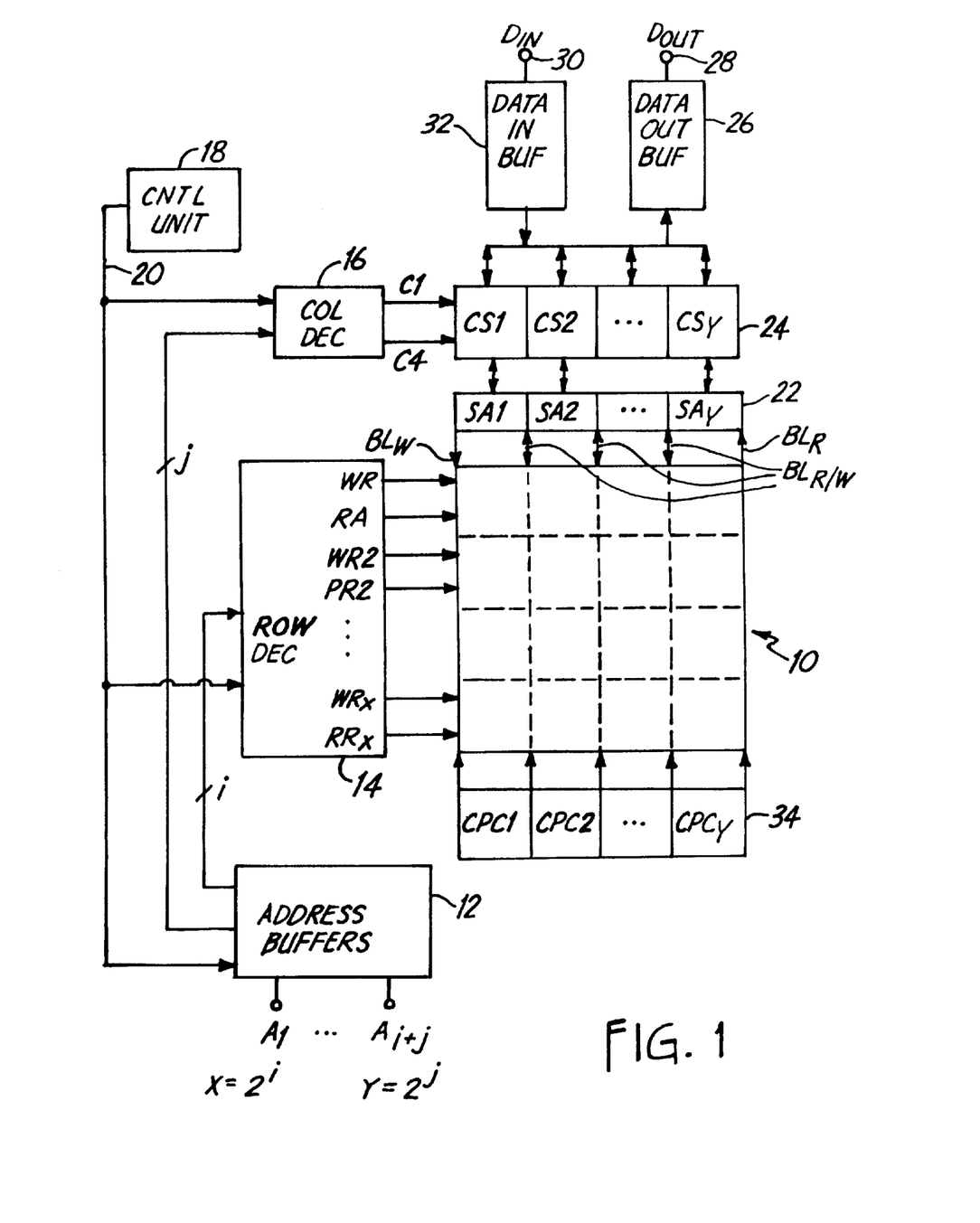
FIG. 1 is a schematic diagram of a integrated circuit including a memory cell array and control circuitry therefor, according to one embodiment of the present invention.

In accordance with the present invention, an integrated circuit including a memory device for a random access memory application is illustrated in FIG. 1. FIG. 1 illustrates a memory cell array 10 and various control circuitry therefor, with the memory cell array 10 configured and arranged to use a relatively small circuit area. According to one specific embodiment realizing more than a thirty percent circuit-area reduction relative to a prior art embodiment, the memory cells are implemented using only two transistors each and with a shared bit line for respectively writing to and reading from adjacent memory cells.

The example implementation of FIG. 1 includes a plurality of memory cells arranged as an X-by-Y array 10. A particular memory cell is accessed by selecting one of the X rows and one of the Y columns. Each memory cell within the array stores a data bit as one of two logic levels. A row of memory cells is selected using an address buffer set 12 that responds to address lines $A_1$ through $A_{i+j}$ for producing select inputs to a row decoder 14 and to a column decoder 16.

For reading and writing to the array 10, a control unit 18 produces conventional control and timing signals, including a read/write control signal at line 20, to each of the address buffer set 12, the row decoder 14 and the column decoder 16. Data is read from the array 10 using a sense amplifier unit 22 that discriminates voltage-level changes on the data lines $BL_R$ and $BL_{R/W}$. The sense amplifier unit 22 outputs to a column select multiplexer 24 that is arranged to respond to the column decoder 16 by routing data from a selected column to a data output buffer 26, and on to an output (or common I/O) terminal 28. Data is written to a memory cell in the array from an input (or common I/O) terminal 30, through a data input buffer 32 and into the column select multiplexer 24. The column select multiplexer 24 responds to the column decoder 16 by routing the data from the data input buffer 32 to a selected bit $BL_W$ or $BL_{R/W}$. A column precharge unit 34 precharges the bit lines to minimize capacitance-related delays during data access operations.

Figure 2:
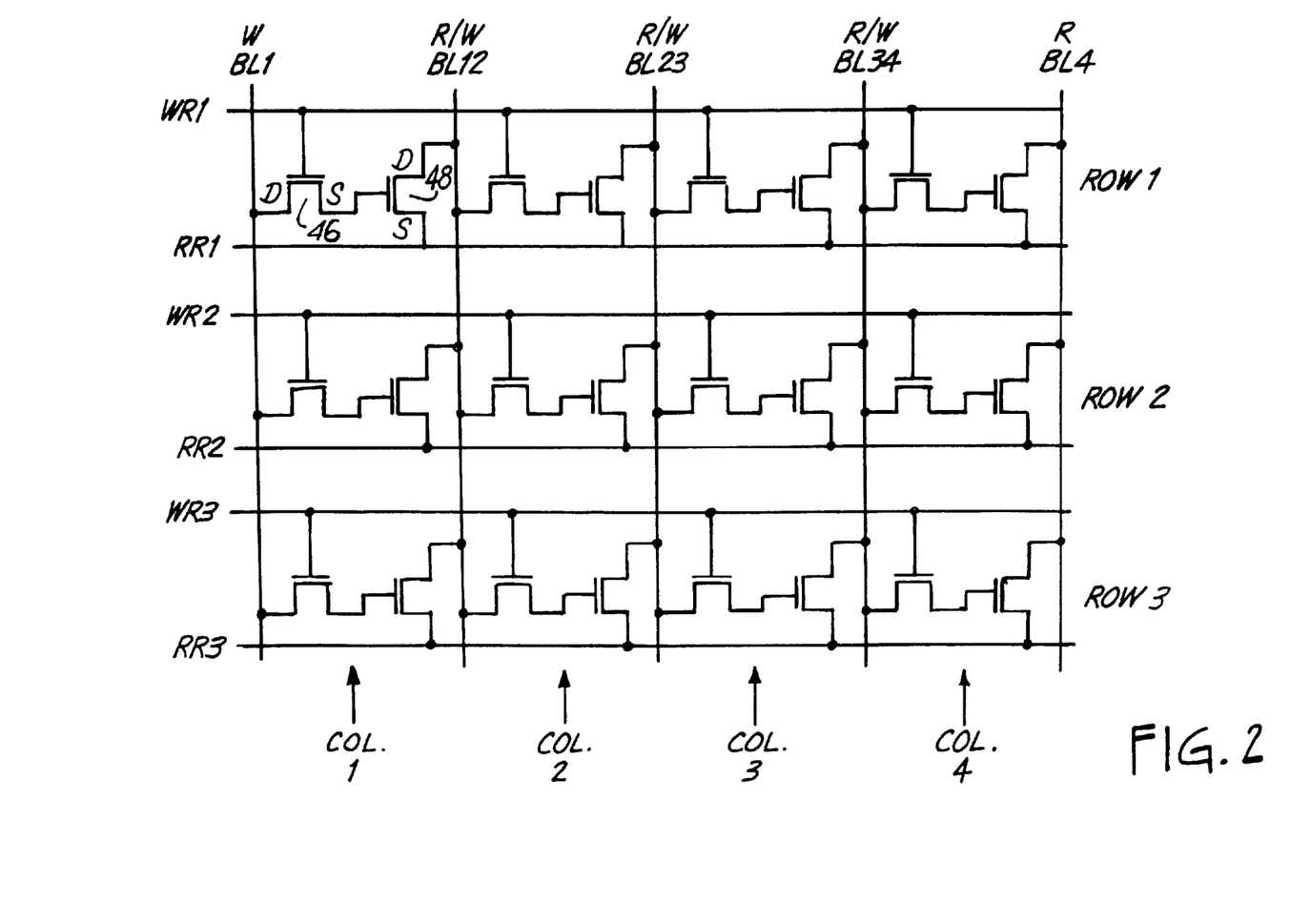
FIG. 2 is a schematic diagram of a portion of a memory array including three rows and four columns, according to another example embodiment of the present invention.

FIG. 2 provides circuit details of a portion of a memory array having twelve cells implemented as three rows and four columns, according to one embodiment of the present invention. Conventional terminology associates "columns" with "bits" and "rows" with "words"; however, these terms may be used interchangeably and can be switched for a particular application. As illustrated in this example of FIG. 2, the cells of the array are labeled by row (1 through 3) and column (1 through 4) and will be referred to as cell ["row", "column"] accordingly. Each of the cells is similarly constructed using two bit lines and two row lines and using a write transistor and a read transistor.

Using cell [1, 1] and cell [1, 2] as representative cells of the array of FIG. 2, cell [1, 1] is constructed using a write transistor 46 and a read transistor 48. The gate of the read transistor 48 (interconnected with the source of the write transistor 46) is used as a storage node.

As illustrated in FIG. 2, the bit lines in the array have assigned functions that depend upon their location within the array. The bit line BL1 at the far left of the array is used for writing data to cells located in the first column (corresponding to cells [_,1]). For the first column of cells, BL1 connects to the drain of each write transistor. The bit line BL4 at the far right of the array is used for reading data from the last column of cells (corresponding to cells [_,4]). For this column of cells, BL4 connects to the drain of each read transistor. Each of the remaining bit lines is advantageously shared by two adjacent columns of cells, for reading from the column of cells to the left of the bit line and for writing to the adjacent column of cells to the right of the bit line. In accordance with the functionality of these bit lines, the symbols "W" (for write) and "R" (for read) are respectively associated with "BL1" and "BL4" in FIG. 2. Each of the other bit lines is used for reading and writing for adjacently located cells and are, therefore, denoted as BL12, BL23 and BL34 along with "R/W" (for read/write). By sharing the inner bit lines (BL12, BL23 and BL34) for adjacent cells, significant reductions are realized in terms of both the array size and the number of elements used to implement the array.

Figure 3A:
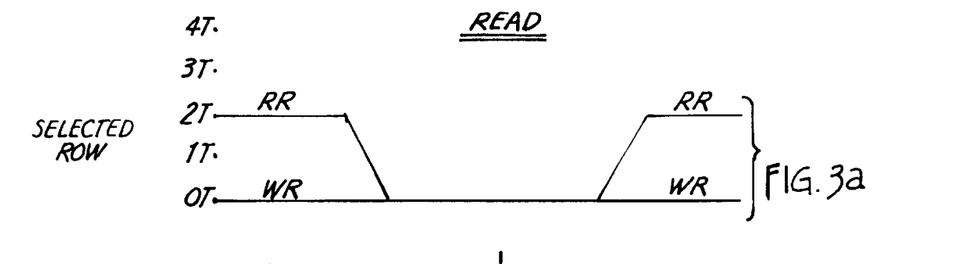
FIGS. 3a through 3d comprise a series of a timing diagram illustrating the read operation for the schematic diagram of FIG. 2.
Figure 3B:
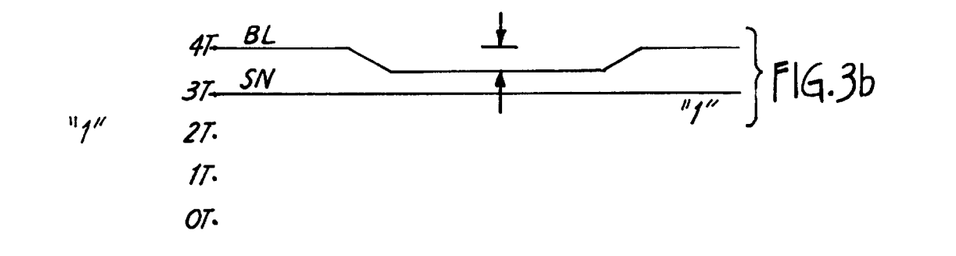
Figure 3C:
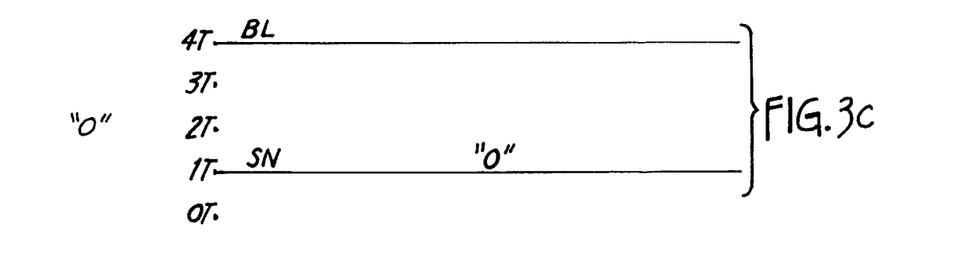
Figure 3D:
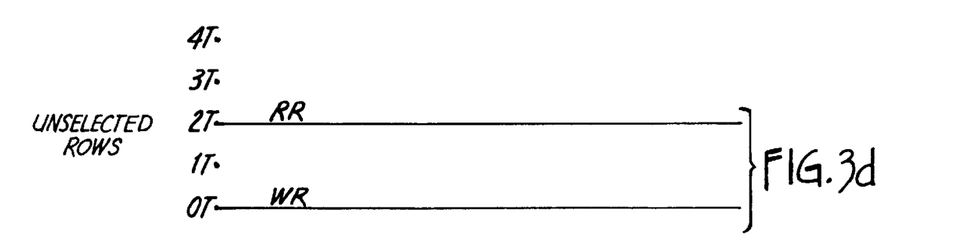

FIGS. 3a through 3d illustrate the timing for a read operation using the example circuit arrangement of FIG. 2. FIGS. 3a and 3d illustrate selected and unselected rows, respectively, using the threshold levels (0T to 4T) of the corresponding read row (RR) and write row (WR) lines, where "T" refers to the nominal threshold voltage for one of the similarly constructed transistors in the array of FIG. 2. Accordingly, assuming each of the transistors illustrated in the array turns on when the gate-source turn-on voltage is greater than "T", "2T" refers to two times the nominal threshold transistor voltage, "3T" refers to three times the nominal threshold transistor voltage, etc.

FIGS. 3a and 3d show that a row is selected when both the write and read row lines are less than 1T and unselected when the corresponding read row line is greater than 1T. For example, cell [1, 1] and cell [1, 2] are potentially activated when RR1 and WR1 are pulled down below 1T. More specifically, in cell [1, 1], WR1 being pulled down below 1T maintains the gate-source voltage of the write transistor 46 in the turn-off condition, and RR1 being pulled down below 1T permits the gate-source voltage of the read transistor 48 to turn-on the transistor 48 based on the charge at its gate (the storage node).

FIG. 3b illustrates such a storage node (SN) previously charged to 3T for storing a logical "1". At cell [1, 1], for example, in response to the RR1 and WR1 lines being at 0T as shown in FIG. 3a, the gate-source voltage of the read transistor 48 turns-on the read transistor 48. Consequently, the drain of the read transistor 48 drops slightly ("ΔV" in FIG. 3b) from its normal, pulled-high level of 4T for detection and conversion by the sense amplifier unit (e.g., 22 of FIG. 1) to the appropriate voltage level for the data output buffer (e.g., 26 of FIG. 1).

FIG. 3c illustrates such a storage node (SN) previously charged to 1T for storing a logical "0". Using cell [1, 1] again as an example cell, in response to the RR1 and WR1 lines being at 0T as shown in FIG. 3a, the gate-source voltage of the read transistor 48 maintains the read transistor 48 in the inactive (or "off") condition. Consequently, the drain of the read transistor 48 is maintained at its normal pulled-high level of 4T for the sense amplifier unit.

Figure 4A:
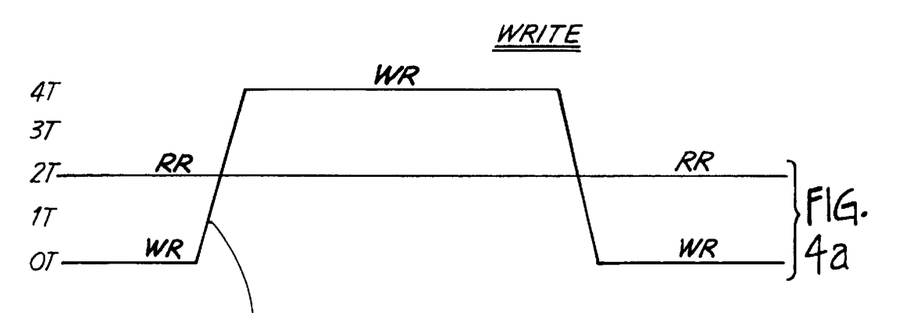
FIGS. 4a through 4d comprise a series of timing diagrams illustrating the write operation for the schematic diagram of FIG. 2.
Figure 4B:
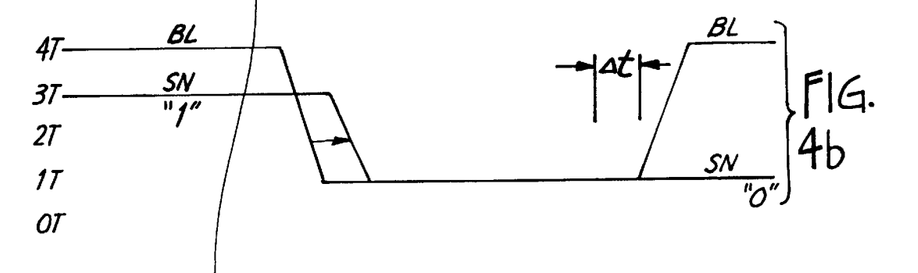
Figure 4C:
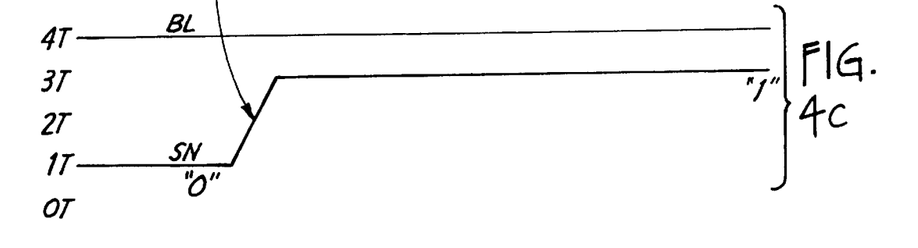
Figure 4D:
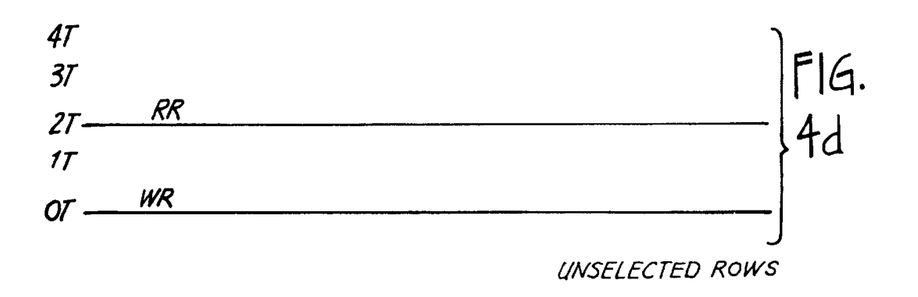

FIGS. 4a through 4d illustrate the timing for a write operation, also using the example circuit arrangement of FIG. 2. FIGS. 4a and 4d illustrate selected and unselected rows, respectively, for a write operation. FIGS. 4a and 4d show that a row is selected for writing to when the write row line transitions up to 4T and the read row line remains at 2T (a level greater than 1T) and unselected when the write row line remains at a level below 1T and the read row line remains at a level above 1T. Thus, the write transistors of each cell are activated when the write row line transitions to a voltage level that is at least one threshold level greater than the voltage level corresponding to a logical "1" at the storage node.

The timing diagrams of FIGS. 4a and 4b illustrate the write operation of a logical "0" to a particular cell. FIG. 4b illustrates the storage node (SN) previously charged to 3T. The corresponding row is selected as shown in FIG. 4a through the level of the write row line increasing to 4T. With the gate of the corresponding write transistor set at 4T and the source of the read transistor being held at 2T by the read row line, the read transistor remains off and the write transistor does not activate until after the bit line connected to drain of the transistor is pulled from its normal 4T voltage level to a 1T level. As the write transistor is activated, the storage node is discharged through the activated write transistor. After the write row line returns to the 0T level, the bit line is returned to its normal 4T voltage level.

The timing diagram of FIGS. 4a and 4c illustrate the write operation of a logical "1" to a particular cell. FIG. 4c illustrates the storage node (SN) previously discharged to a 1T level for a given cell. The corresponding row is selected as shown in FIG. 4a through the level of the write row line increasing to 4T. With the gate of the corresponding write transistor set at 4T and the source of the read transistor being held at 2T by the read row line (FIG. 4a), the read transistor is maintained in the off condition throughout the write operation and the write transistor is "on" in response to the write row line being sufficiently increased in level. As the write transistor is activated, the storage node is charged through the activated write transistor to its 3T level; this corresponds to the 4T level of the bit line minus one threshold level (1T) attributed to the drop across the write transistor.

If leakage causes the voltage at the storage node to drop slightly from the 3T logical "1" level, for instance as might be expected at about the time for a refresh operation, the storage node can be returned to its 3T voltage level. For example, a refresh operation can be implemented by reading the logical "1" level as discussed above in connection with FIGS. 3a and 3b, then writing the logical "1" level as described in connection with FIGS. 4a and 4c.

Figure 5:
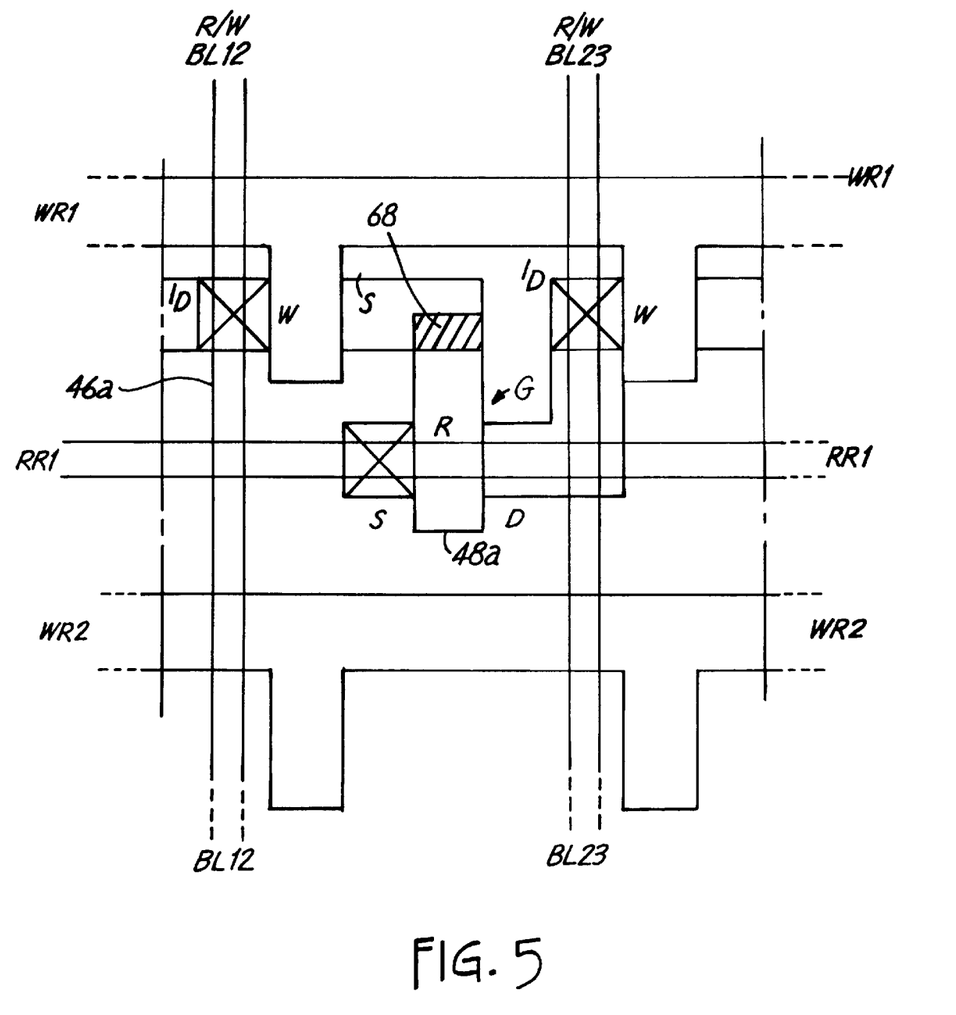
FIGS. 5 and 6 are respective layout implementations, according to other example embodiments of the present invention and corresponding to the schematic shown in FIG. 2.
Figure 6:
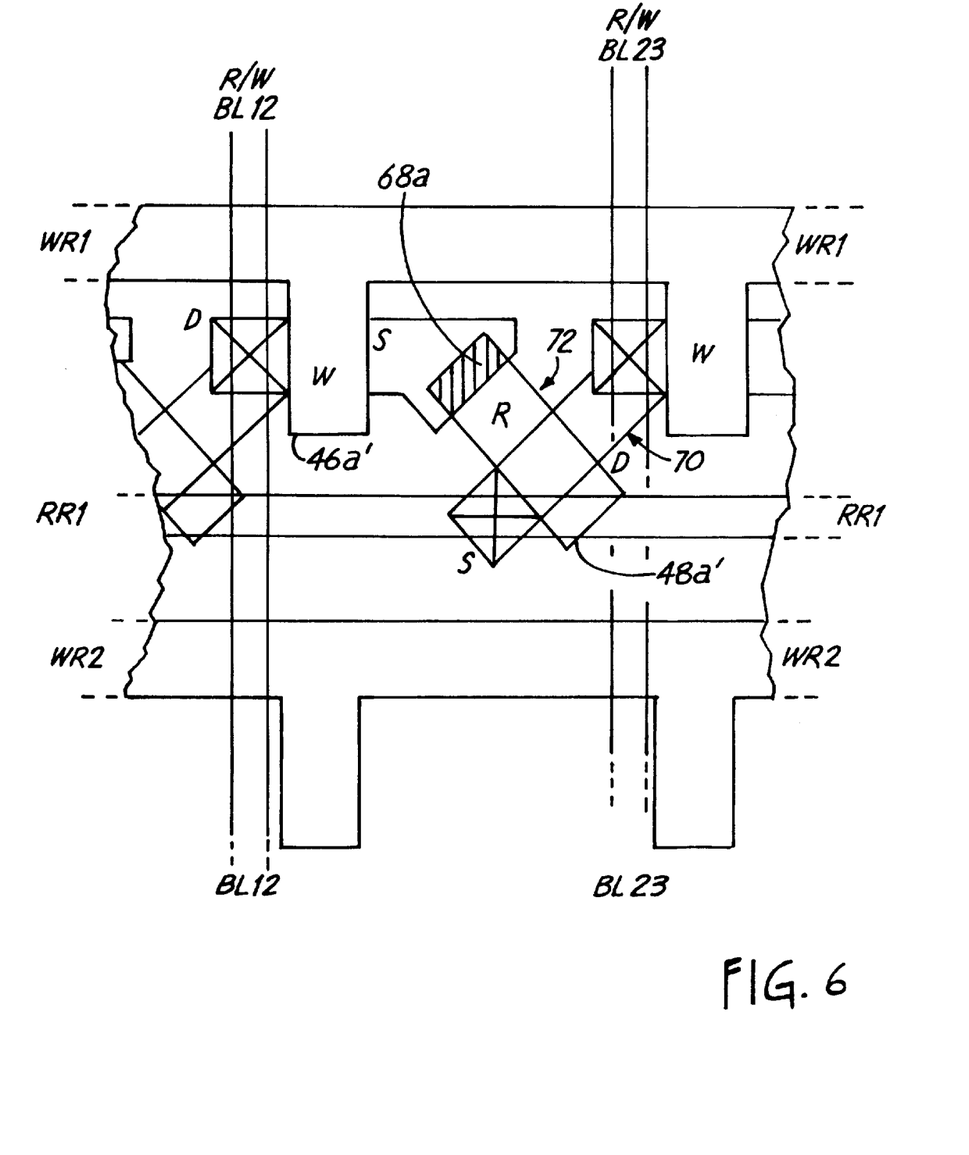

FIGS. 5 and 6 are respective layout implementations, according to other example embodiments of the present invention and corresponding to a particular cell of the circuit arrangement shown in FIG. 2. The cell [1,2] of FIG. 2 is used as a representative one of the cells in the array, with partial inclusion of adjacent cells shown on opposite sides of read/write bit lines. The write ("W") and read ("R") transistors 46a and 48a are shown by way of their respective drains ("D"), gates ("G") and sources ("S"). For example, the storage node at interconnection 68 shows the gate ("G") of the read transistor 48a connected to the source ("S") of the write transistor 46a.

FIG. 6 is slightly modified from FIG. 5 in that each of two layers is turned at a forty-five degree angle to further reduce the layout area. A first angled diffusion layer 70 is used to interconnect BL23 with the drain of the read transistor 48a'. Another angled (polysilicon) layer 72 corresponds to the storage node at interconnection 68a where the source of the write transistor 46a' is interconnected with the gate of the read transistor 48a'. In FIG. 6, the interconnects are arranged with the drain of the read transistor being shared with the drain of the write transistor of the adjacent cell in a manner that is more space efficient.

The advantages realized by each layout approach include relatively wide spacing of interconnect levels and implementation in an area significantly reduced relative to previous approaches. The layout of FIG. 6 improves over the layout of FIG. 5 by reducing the cell area by another seven to ten percent. The FIG. 6 layout approach is also advantageous over the layout of FIG. 5 in that the smaller-sized diffusion layer 70 of FIG. 6 realizes less capacitance, provides faster access and uses less power.

As an optional enhancement to one or more of the cells depicted above, the charge-retainment ability of the storage node can be enhanced using a high-C capacitor, by making the gate oxide thinner, and/or by using a gate insulator with a higher dielectric constant.

The various embodiments described above are provided by way of illustration only and should not be construed to limit the invention. Those skilled in the art will readily recognize various modifications which may be made to the present invention without strictly following the exemplary embodiments and applications illustrated and described herein. Such modifications include designing the various transistors in each cell so that they have voltage thresholds that are not identical to each other, and adding components in one or more of the cells to provide additional features, such as added capacitance at the storage node. Unless specifically indicated, such changes do not depart from the true spirit and scope of the present invention which is set forth in the following claims.

What is claimed is:

1. An integrated circuit, comprising:
   a plurality of row lines, including a write row line and a read row line arranged parallel to one another and along a first direction;
   a plurality of bit lines; and
   a semiconductor array of memory cells arranged in rows and columns, with each memory cell to be accessed in response to levels established on selected ones of the row and bit lines, and first and second memory cells being immediately and adjacently-located in immediately-adjacent columns on either side of one of the bit lines, wherein the immediately-adjacent columns include said one of the bit lines, said one of the bit lines interconnecting a first MOS-based transistor in the first memory cell for writing to the first memory cell and a second MOS-based transistor in the second memory cell for reading from the second memory cell.

2. An integrated circuit, according to claim 1, wherein the first MOS-based transistor has its drain connected to the drain of the second MOS-based transistor.

3. An integrated circuit, according to claim 2, wherein the drain of the first MOS-based transistor is connected to the drain of the second MOS-based transistor using an interconnecting layer arranged substantially at a right angle relative to the first direction.

4. An integrated circuit, according to claim 2, wherein the drain of the first MOS-based transistor is connected to the drain of the second MOS-based transistor using an interconnecting layer arranged at an acute angle relative to the first direction.

5. An integrated circuit, according to claim 1, further including a third MOS-based transistor within the first memory cell, said third MOS-based transistor having a source connected with a gate of the first MOS-based transistor.

6. An integrated circuit, according to claim 1, wherein the drain of the first MOS-based transistor is connected to the drain of the second MOS-based transistor using an interconnecting layer arranged substantially at a right angle relative to the first direction, and further including a third MOS-based transistor within the first memory cell, said third MOS-based transistor having a source connected with a gate of the first MOS-based transistor.

7. An integrated circuit, according to claim 6, wherein the third MOS-based transistor has its source connected with the gate of the first MOS-based transistor using an interconnecting layer arranged at an acute angle relative to the first direction.

8. An integrated circuit, according to claim 7, wherein the gate of the first MOS-based transistor is a storage node.

9. An integrated circuit, according to claim 6, wherein the third MOS-based transistor has its source connected with the gate of the first MOS-based transistor using two interconnecting layers arranged substantially at a right angle relative to one another.

10. An integrated circuit, according to claim 7, wherein the third MOS-based transistor has its source connected with the gate of the first MOS-based transistor using two interconnecting layers arranged at an obtuse angle relative to one another.

11. A method for storing and retrieving data, comprising:

providing a semiconductor array of memory cells arranged in rows and columns using row lines and bit lines, including a write row line and a read row line arranged parallel to one another and along a first direction and including at least one bit line located between a first memory cell and a second memory cell, wherein the first memory cell is in a first column, and wherein the second memory cell is in a second column immediately-adjacent the first column; and storing data in the first memory cell by biasing said at least one bit line and retrieving data in the second memory cell by sensing said at least one bit line.

* * * * *